US012609678B2

(12) United States Patent
Li et al.

(10) Patent No.: US 12,609,678 B2
(45) Date of Patent: Apr. 21, 2026

(54) SEMICONDUCTOR DEVICE, INTERFACE DEVICE AND OPERATION METHOD

(71) Applicants: Global Unichip Corporation, Hsinchu (TW); Taiwan Semiconductor Manufacturing Company, Ltd., Hsinchu (TW)

(72) Inventors: Bi-Yang Li, Hsinchu (TW); Igor Elkanovich, Hsinchu (TW); Hung-Yi Chang, Hsinchu (TW); Shih-Cheng Kao, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 168 days.

(21) Appl. No.: 18/764,159

(22) Filed: Jul. 4, 2024

(65) Prior Publication Data

US 2026/0012160 A1     Jan. 8, 2026

(51) Int. Cl.
| | |
|---|---|
| *H03K 3/012* | (2006.01) |
| *H03K 5/00* | (2006.01) |
| *H03K 5/135* | (2006.01) |
| *H03K 5/14* | (2014.01) |
| *H03K 19/0175* | (2006.01) |
| *H03L 7/081* | (2006.01) |

(52) U.S. Cl.
CPC .............. *H03K 3/012* (2013.01); *H03K 5/135* (2013.01); *H03K 5/14* (2013.01); *H03K*

*19/017509* (2013.01); *H03L 7/0812* (2013.01); *H03K 2005/00019* (2013.01)

(58) Field of Classification Search
CPC .......... H03L 7/0812; H03K 19/017509; H03K 5/14; H03K 3/012; H03K 5/135
See application file for complete search history.

(56) References Cited

U.S. PATENT DOCUMENTS

| | | | | |
|---|---|---|---|---|
| 6,380,776 | B1 * | 4/2002 | Yocom | .................... H03L 7/091 327/155 |
| 11,474,554 | B2 * | 10/2022 | Wang | ......................... G06F 1/08 |
| 11,528,029 | B2 * | 12/2022 | Tang | ......................... G06F 1/12 |
| 12,372,998 | B2 * | 7/2025 | Boecker | .................... G06F 1/10 |
| 2026/0010193 | A1 * | 1/2026 | Li | ............................. G06F 1/10 |

* cited by examiner

*Primary Examiner* — Menatoallah Youssef
*Assistant Examiner* — Khareem E Almo
(74) *Attorney, Agent, or Firm* — JCIPRNET

(57) ABSTRACT

An interface device includes a first controllable delay line (CDL), a first clock generator (CG), a phase detector (PD), a second CDL, and a second CG arranged on a second die. The first CDL delays a source clock signal of a first die to generate a first delayed clock signal. The first CG generates a second delayed clock signal according to the first delayed clock signal. The second CDL delays the source clock signal of the first die to generate a third delayed clock signal. The second CG generates a fourth delayed clock signal according to the third delayed clock signal. Based on a phase difference between a gained clock signal of the first die and the second delayed clock signal detected by the PD, the CDLs adjusts the delay amounts of the source clock signal.

39 Claims, 6 Drawing Sheets

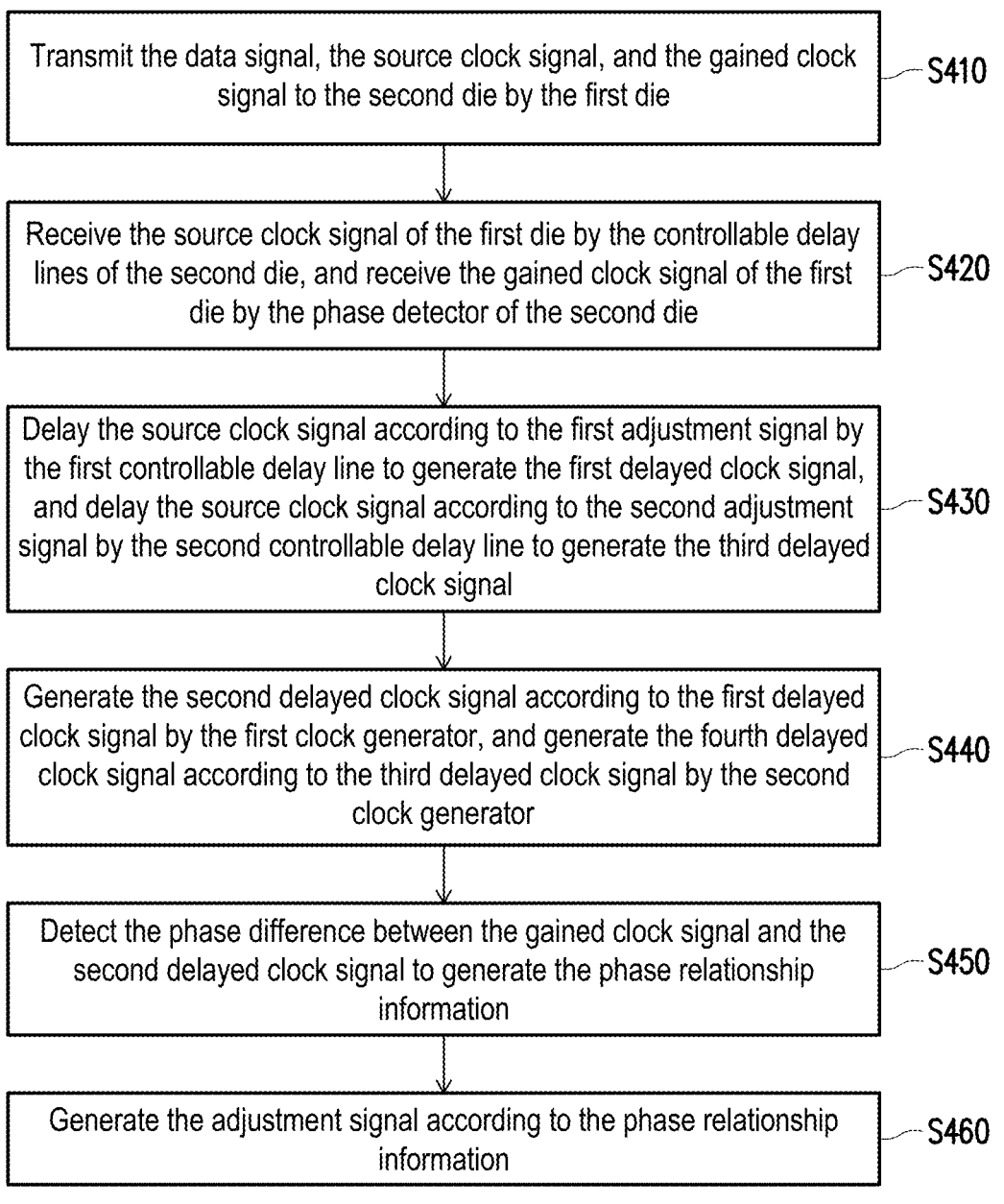

Transmit the data signal, the source clock signal, and the gained clock signal to the second die by the first die — S410

Receive the source clock signal of the first die by the controllable delay lines of the second die, and receive the gained clock signal of the first die by the phase detector of the second die — S420

Delay the source clock signal according to the first adjustment signal by the first controllable delay line to generate the first delayed clock signal, and delay the source clock signal according to the second adjustment signal by the second controllable delay line to generate the third delayed clock signal — S430

Generate the second delayed clock signal according to the first delayed clock signal by the first clock generator, and generate the fourth delayed clock signal according to the third delayed clock signal by the second clock generator — S440

Detect the phase difference between the gained clock signal and the second delayed clock signal to generate the phase relationship information — S450

Generate the adjustment signal according to the phase relationship information — S460

FIG. 4

SEMICONDUCTOR DEVICE, INTERFACE DEVICE AND OPERATION METHOD

BACKGROUND

Technical Field

The disclosure relates to an electronic circuit, and more particularly, to a semiconductor device, an interface device, and an operation method of the interface device

Description of Related Art

In a physical layer of an integrated circuit, a clock tree circuit is often needed to generate a clock signal configured to sample a data signal. However, during a transmission process, signal transmission delays are inevitable. In a three-dimensional stacked semiconductor element, during a data transmission process between different dies, the data signal and the clock signal are prone to misalignment. Under such circumstances, in the conventional technology, a delay string is often added to a transmission path of the data signal to adjust a transmission phase of the data signal, in the hope that the data signal and the clock signal may be aligned with each other.

Generally speaking, the data signal often has multiple bits. That is, the transmission path of the data signal often has multiple wires. Under such circumstances, a large number of delay strings are often required to be disposed in the transmission path of the data signal between different dies in order to adjust the transmission phase of the data signal. The configuration of the large number of delay strings means that a large amount of layout area is consumed. In addition, when transition of the data signal occurs, the large number of delay strings will also cause unnecessary power consumption due to the transition of the data signal, reducing a working performance of the semiconductor element.

SUMMARY

The disclosure provides a semiconductor device, an interface device, and an operation method to transmit clock signals between different dies.

In an embodiment of the disclosure, the interface device is adapted for a semiconductor device. The semiconductor device includes a first die and a second die. The first die and the second die are electrically connected to be stacked into a 3D structure. The interface device includes a first controllable delay line, a first clock generator, a phase detector, a second controllable delay line, and a second clock generator arranged on the second die. The first controllable delay line and the second controllable delay line receive a first source clock signal from the first die. The first controllable delay line adjusts a first delay amount to the first source clock signal according to a first adjustment signal, thereby delaying the first source clock signal to generate a first delayed clock signal. The first clock generator is coupled to the first controllable delay line to receive the first delayed clock signal. The first clock generator generates a second delayed clock signal according to the first delayed clock signal. The phase detector receives a first gained clock signal from the first die. The phase detector is coupled to the first clock generator to receive the second delayed clock signal. The phase detector detects a phase difference between the first gained clock signal and the second delayed clock signal to generate phase relationship information. The second controllable delay line adjusts a second delay amount to the first source clock signal according to a second adjustment signal (the first delay amount is different from the second delay amount), thereby delaying the first source clock signal to generate a third delayed clock signal. The second clock generator is coupled to the second controllable delay line to receive the third delayed clock signal. The second clock generator generates a fourth delayed clock signal according to the third delayed clock signal. The first adjustment signal and the second adjustment signal are generated according to the phase relationship information.

In an embodiment of the disclosure, the operation method includes the following. A first source clock signal from the first die is received by a first controllable delay line of the interface device. The first controllable delay line is arranged on the second die. A first delay amount to the first source clock signal is adjusted according to a first adjustment signal, thereby delaying the first source clock signal to generate a first delayed clock signal by the first controllable delay line.

A second delayed clock signal is generated according to the first delayed clock signal by a first clock generator of the interface device. The first clock generator is arranged on the second die, and the first clock generator is coupled to the first controllable delay line to receive the first delayed clock signal. A first gained clock signal from the first die is received by a phase detector of the interface device. The phase detector is arranged on the second die, and the phase detector is coupled to the first clock generator to receive the second delayed clock signal. A phase difference between the first gained clock signal and the second delayed clock signal is detected by the phase detector to generate phase relationship information. The first source clock signal from the first die is received by a second controllable delay line of the interface device. The second controllable delay line is arranged on the second die. A second delay amount to the first source clock signal is adjusted according to a second adjustment signal, thereby delaying the first source clock signal to generate a third delayed clock signal by the second controllable delay line. The first delay amount is different from the second delay amount. A fourth delayed clock signal is generated according to the third delayed clock signal by a second clock generator of the interface device. The second clock generator is arranged on the second die, and the second clock generator is coupled to the second controllable delay line to receive the third delayed clock signal. The first adjustment signal and the second adjustment signal are generated according to the phase relationship information.

In an embodiment of the disclosure, the semiconductor device includes a first clock transmission circuit arranged on the first die and a first controllable delay line, a first clock generator, a first phase detector, a second controllable delay line, and a second clock generator arranged on the second die. The first clock transmission circuit receives a first source clock signal of the first die. The first clock transmission circuit generates a first gained clock signal based on the first source clock signal. The first controllable delay line and the second controllable delay line receive the first source clock signal from the first die. The first controllable delay line adjusts a first delay amount to the first source clock signal according to a first adjustment signal, thereby delaying the first source clock signal to generate a first delayed clock signal. The first clock generator is coupled to the first controllable delay line to receive the first delayed clock signal. The first clock generator generates a second delayed clock signal according to the first delayed clock signal. The first phase detector receives the first gained clock signal from the first die. The first phase detector is coupled to the first clock generator to receive the second delayed clock signal. The first phase detector detects a phase difference between the first gained clock signal and the second delayed clock signal to generate first phase relationship information. The second controllable delay line adjusts a second delay amount to the first source clock signal according to a second adjustment signal, thereby delaying the first source clock signal to generate a third delayed clock signal. The first delay amount is different from the second delay amount. The second clock generator is coupled to the second controllable delay line to receive the third delayed clock signal. The second clock generator generates a fourth delayed clock signal according to the third delayed clock signal. The first adjustment signal and the second adjustment signal are generated according to the first phase relationship information.

Based on the source clock signal of the first die, the clock transmission circuit of the first die may generate the gained clock signals to trigger transmission of data signals of the first die. The first die may output double data rate (DDR) data (e.g., a data signal, an address signal, etc.), the source clock signal, and the gained clock signal to the second die. However, during a transmission process, signal transmission delays are inevitable due to an influence of changes in process-voltage-temperature (PVT). A transmission channel of the gained clock signal is similar to a transmission channel of the DDR data. Therefore, a transmission delay of the gained clock signal is approximately the same as a transmission delay of the DDR data. The second die may adjust the delay amount to the source clock signal of the first die based on phase of the gained clock signal of the first die to generate the delayed clock signal. Since the second die may enable the delayed clock signal to track and align the phase of the gained clock signal, a phase of the delayed clock signal may be easily aligned with a phase of the data signal.

In order for the aforementioned features and advantages of the disclosure to be more comprehensible, embodiments accompanied with drawings are described in detail below.

BRIEF DESCRIPTION OF THE DRAWINGS

FIG. 4 is a schematic flowchart of an operation method of an interface device according to an embodiment of the disclosure.

DETAILED DESCRIPTION OF DISCLOSED EMBODIMENTS

Figures 1A, 1B:
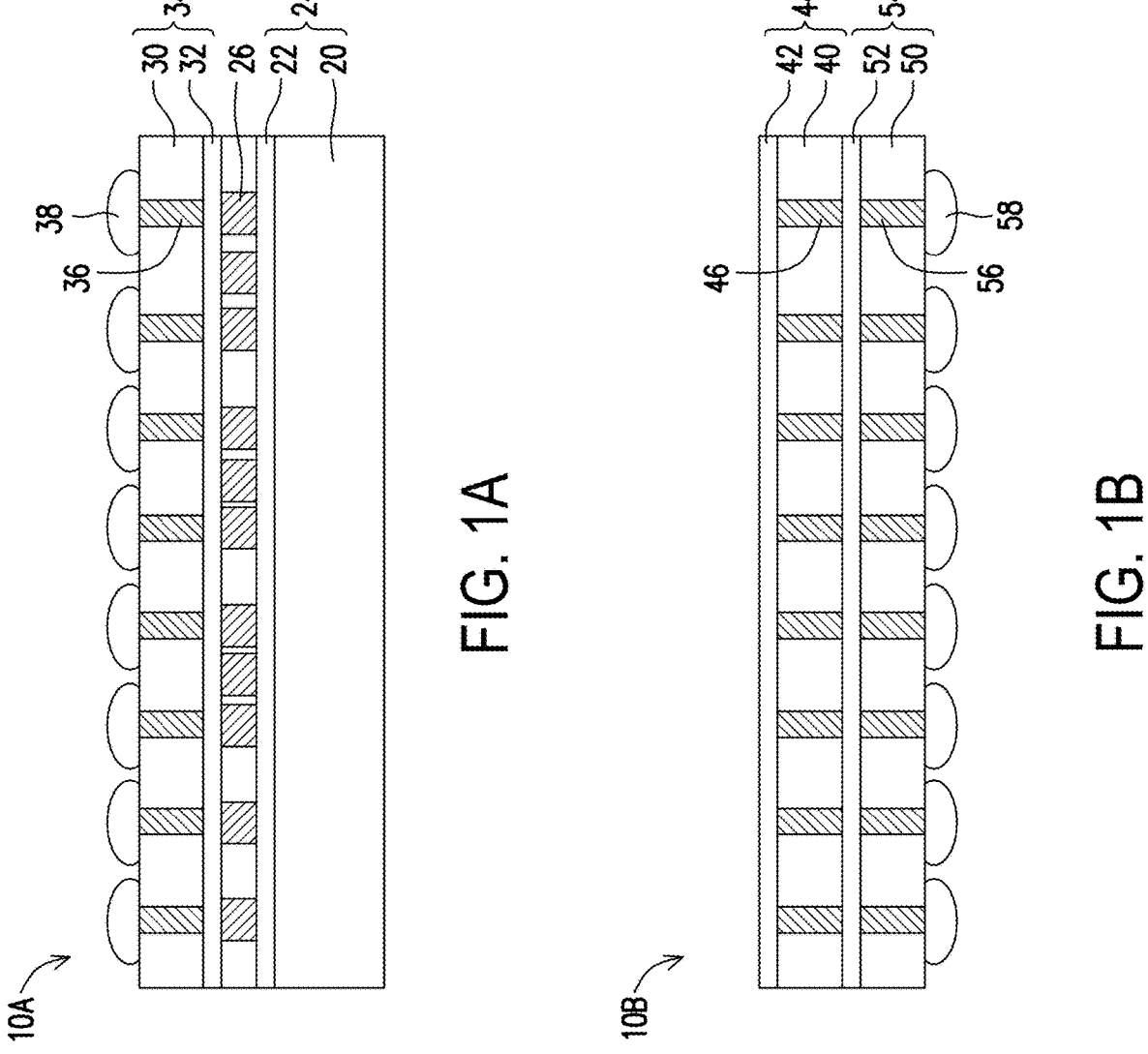
FIG. 1A is a schematic cross-sectional view of a 3D structure of a semiconductor device according to an embodiment.
FIG. 1B is a schematic cross-sectional view of a 3D structure of a semiconductor device according to another embodiment.

The term "coupling (or connection)" as used throughout the present specification (including the claims) may refer to any direct or indirect connection means. For example, if it is described that a first device is coupled (or connected) to a second device, it should be interpreted that the first device can be directly connected to the second device, or the first device can be indirectly connected to the second device through other devices or a certain connection means. The terms "first", "second" and the like as mentioned throughout the present specification (including the claims) are used to name the elements or to distinguish between different embodiments or scopes, rather than setting an upper or lower limit on the number of the elements or the order of the elements. In addition, wherever possible, elements/components/steps with the same reference numerals in the drawings and embodiments represent the same or similar parts. Cross-reference may be made between the elements/components/steps in different embodiments that are denoted by the same reference numerals or that have the same names.

The disclosure relates to data transmission between two dies. Several embodiments are provided below to introduce the disclosure, but the implementation of the disclosure is not limited to the embodiments.

FIG. 1A is a schematic cross-sectional view of a 3D structure of a semiconductor device 10A according to an embodiment. The semiconductor device 10A may include a die 24 and a die 34. In addition to being distributed horizontally, the die 24 and the die 34 may also be stacked vertically. The die 24 and the die 34 are electrically connected to each other and stacked into a 3D structure to form a 3D semiconductor element. Any 3D packaging technology may be adopted for a stacked structure of the semiconductor device 10A, such as system-on-integrated-chips (SoIC) packaging, wafer on wafer (WoW) packaging, chip-on-wafer-on-substrate (CoWoS) packaging, or other 3D packaging technology.

In some practical applications (but not limited thereto), the die 34 may be a slave device, and the die 24 may be a master device. The die 24 usually includes a substrate 20 and a circuit layer 22. The die 34 is stacked above the die 24. At least one bump 26 (e.g., a microbump or a hybrid-bump) is formed between the die 24 and the die 34. The die 34 includes a substrate 30 and a circuit layer 32. A through-hole structure of a packaging process, such as a through-silicon-via (TSV) 36 with a connection pad portion 38, is formed at a corresponding position of the die 34. The connection pad portion 38 is formed at a position corresponding to an outermost surface of the TSV 36.

FIG. 1B is a schematic cross-sectional view of a 3D structure of a semiconductor device 10B according to another embodiment. The semiconductor device 10B may include a die 44 and a die 54. In addition to being distributed horizontally, the die 44 and the die 54 may also be stacked vertically. The die 44 and the die 54 are electrically connected to each other and stacked into a 3D structure to form a 3D semiconductor element. Any 3D packaging technology may be adopted for a stacked structure of the semiconductor device 10B, such as SoIC packaging, WoW packaging, CoWoS packaging, or other 3D packaging technology. In some practical applications (but not limited thereto), the die 54 may be a slave device, and the die 44 may be a master device. The die 44 usually includes a substrate 40 and a circuit layer 42. A through-hole structure of a packaging process, such as a TSV 46, is formed between the die 44 and the die 54. The die 54 includes a substrate 50 and a circuit layer 52. A TSV 56 with a connection pad portion 58 is formed at a corresponding position of the die 54. The connection pad portion 58 is formed at a position corresponding to an outermost surface of the TSV 56.

Figure 2:
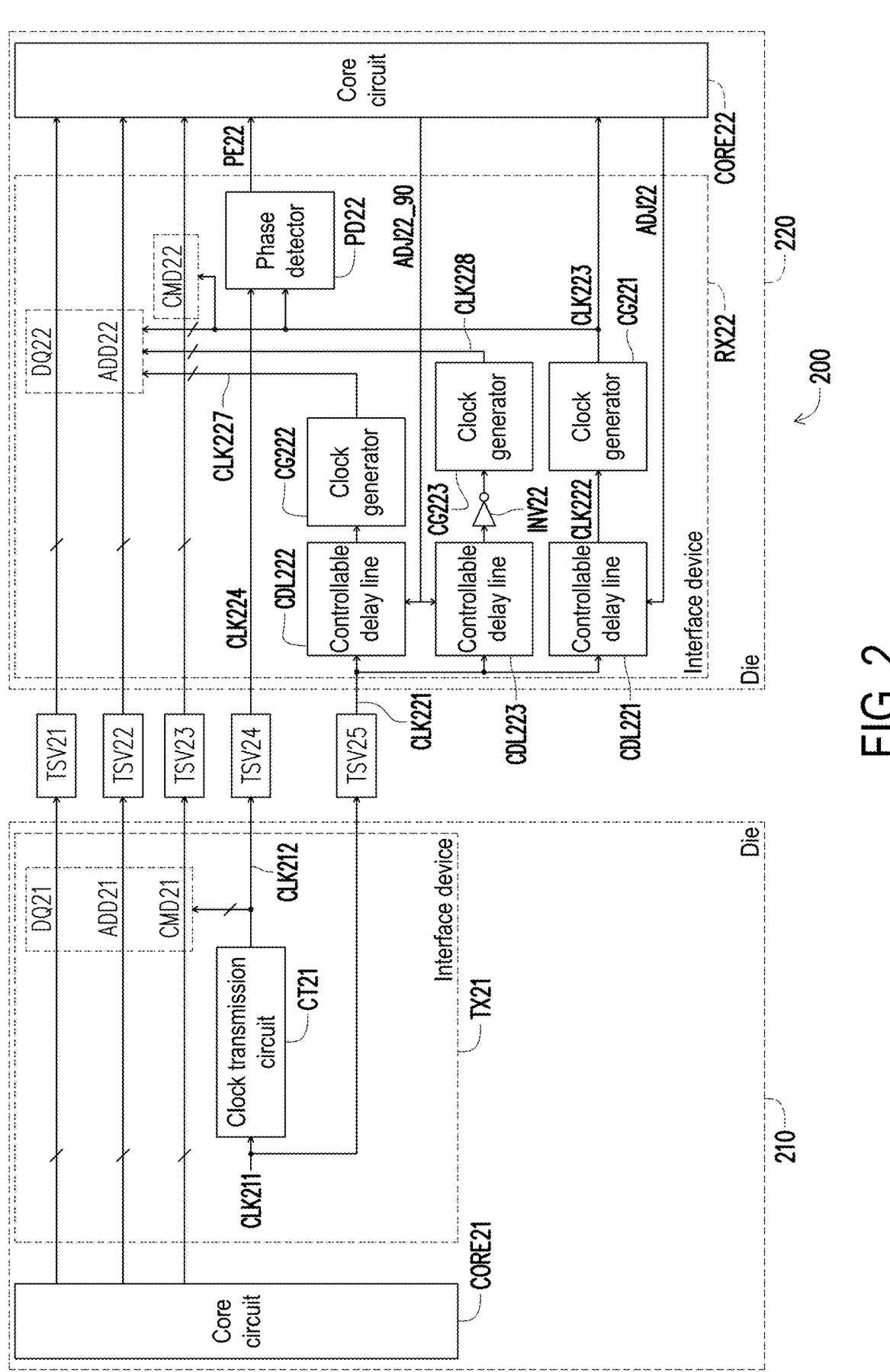
FIG. 2 is a schematic view of a circuit block of a semiconductor device according to an embodiment of the disclosure.

FIG. 2 is a schematic view of a circuit block of a semiconductor device 200 according to an embodiment of the disclosure. The semiconductor device 200 shown in FIG. 2 includes a die 210 and a die 220. The die 210 and the die 220 may be electrically connected to each other. For example, in the embodiment shown in FIG. 2, the die 210 may be electrically connected to the die 220 through TSVs TSV21, TSV22, TSV23, TSV24, and TSV25 (or a bump). According to an actual design, the die 210 and the die 220 may be stacked into a 3D structure. For example, in some application examples, the die 210 and the die 220 shown in FIG. 2 may refer to the relevant descriptions of the die 24 and the die 34 shown in FIG. 1A and be derived by analogy (in this case, the TSVs TSV21, TSV22, TSV23, TSV24 and TSV25 may be implemented using the bumps instead, that is, the TSVs TSV21, TSV22, TSV23, TSV24 and TSV25 shown in FIG. 2 may refer to the relevant description of the bump 26 shown in FIG. 1A and be derived by analogy). In another application examples, the die 210 and the die 220 shown in FIG. 2 may refer to the relevant descriptions of the die 44 and the die 54 shown in FIG. 1B and be derived by analogy (in this case, the TSVs TSV21, TSV22, TSV23, TSV24 and TSV25 shown in FIG. 2 may refer to the relevant description of the TSV 46 shown in FIG. 1B and be derived by analogy).

The die 210 includes a core circuit CORE21 and an interface device TX21, and the die 220 includes a core circuit CORE22 and an interface device RX22. According to different designs, in some embodiments, implementation of the core circuits CORE21 and/or CORE22 may be a hardware circuit. In other embodiments, the implementation of the core circuits CORE21 and/or CORE22 may be firmware. In still some embodiments, the implementation of the core circuits CORE21 and/or CORE22 may be a combination of hardware and firmware.

In terms of the hardware, the core circuits CORE21 and/or CORE22 may be implemented in a logic circuit on an integrated circuit. For example, related functions of the core circuits CORE21 and/or CORE22 may be implemented in one or more controllers, microcontrollers, microprocessors, application-specific integrated circuits (ASIC), digital signal processors (DSP), field programmable gate arrays (FPGA), central processing units (CPU), and/or various logic blocks, modules, and circuits in other processing units. The related functions of the core circuits CORE21 and/or CORE22 may be implemented as the hardware circuit using hardware description languages (such as Verilog HDL or VHDL) or other suitable programming languages, such as various logic blocks, modules, and circuits in the integrated circuit.

In terms of the firmware, the related functions of the core circuits CORE21 and/or CORE22 may be implemented as programming codes. For example, the core circuits CORE21 and/or CORE22 may be implemented using general programming languages (such as C, C++, or assembly languages), or other suitable programming languages. The programming codes may be recorded/stored in a "non-transitory machine-readable storage medium". In some embodiments, the non-transitory machine-readable storage medium includes, for example, a semiconductor memory and/or a storage device. An electronic device (such as the CPU, controller, microcontroller, or microprocessor) may read and execute the programming codes from the non-transitory machine-readable storage medium, thereby implementing the related functions of the core circuits CORE21 and/or CORE22.

The interface device TX21 of the die 210 includes a clock transmission circuit CT21. The clock transmission circuit CT21 receives a source clock signal CLK211 of the die 210 and generates multiple gained clock signals CLK212 based on the source clock signal CLK211. The clock transmission circuit CT21 may gain fan-out of the source clock signal CLK211. Based on triggering of the gained clock signal CLK212, the interface device TX21 may output a double data rate (DDR) data signal (e.g., a data signal DQ21, an address signal ADD21, etc.) and a single data rate (SDR) data signal (e.g., a command signal CMD21, etc.) of the die 210 to the die 220. During a gain process of the source clock signal CLK211, a transmission delay of the signals is inevitable. Therefore, the gained clock signal CLK212 lags the source clock signal CLK211.

The interface device RX22 of the die 220 includes a controllable delay line CDL221, a controllable delay line CDL222, a controllable delay line CDL223, a clock generator CG221, a clock generator CG222, a clock generator CG223, a NOT gate INV22, and a phase detector PD22 arranged on the die 220. The source clock signal CLK211 of the die 210 becomes a source clock signal CLK221 through the TSV TSV25. The controllable delay line CDL221 receives the source clock signal CLK221 from the die 210. The controllable delay line CDL221 adjusts a delay amount (a first delay amount) to the source clock signal CLK221 according to an adjustment signal ADJ22, and then delays the source clock signal CLK221 to generate a delayed clock signal CLK222. In this embodiment, specific implementation of the controllable delay line CDL221 is not limited. For example, based on the actual design, the controllable delay line CDL221 may include a digital controlled delay line (DCDL) controlled by the adjustment signal ADJ22 or other delay circuits. The DCDL receives the source clock signal CLK221 and delays the source clock signal CLK221 according to the adjustment signal ADJ22 to generate the delayed clock signal CLK222.

Similar to the controllable delay line CDL221, the controllable delay lines CDL222 and CDL223 receive the source clock signal CLK221 from the die 210. The controllable delay lines CDL222 and CDL223 adjust the delay amount (a second delay amount and a third delay amount) to the source clock signal CLK221 according to an adjustment signal ADJ22_90, and then delay the source clock signal CLK221 to generate a delayed clock signal. Specific implementation of the controllable delay lines CDL222 and CDL223 may refer to the relevant description of the controllable delay line CDL221 and be derived by analogy. Therefore, the same details will not be repeated in the following. According to the adjustment signal ADJ22_90, a phase of the delayed clock signal generated by the controllable delay lines CDL222 and CDL223 is approximately 90° different from a phase of the delayed clock signal CLK222 generated by the controllable delay line CDL221. An input end of the NOT gate INV22 is coupled to an output end of the controllable delay line CDL223 to receive the delayed clock signal.

The clock generator CG221 is coupled to the controllable delay line CDL221 to receive the delayed clock signal CLK222. The clock generator CG221 generates a delayed clock signal CLK223 according to the delayed clock signal CLK222. The clock generator CG221 may gain fan-out of the delayed clock signal CLK222. During a gain process of the delayed clock signal CLK222, a transmission delay of the signals is inevitable. Therefore, the delayed clock signal CLK223 lags the delayed clock signal CLK222. In this embodiment, specific implementation of the clock generator CG221 is not limited. For example, based on the actual design, the clock generator CG221 may include a clock tree circuit or other clock circuits. The clock tree circuit is coupled to the controllable delay line CDL221 to receive the delayed clock signal CLK222. The clock tree circuit generates the delayed clock signal CLK223 according to the delayed clock signal CLK222.

Similar to the clock generator CG221, input ends of the clock generators CG222 and CG223 are respectively coupled to the output end of the controllable delay line CDL222 and the output end of the NOT gate INV22 to receive the corresponding delayed clock signals. The clock generator CG222 generates a delayed clock signal CLK227 according to the delayed clock signal output by the controllable delay line CDL222. The clock generator CG223 generates a delayed clock signal CLK228 according to the delayed clock signal output by the NOT gate INV22. The clock generators CG222 and CG223 may refer to the relevant description of the clock generator CG221 and be derived by analogy. Therefore, the same details will not be repeated in the following. In this embodiment, a delay amount of the clock generator CG222 and a delay amount of the clock generator CG223 are approximately equal to a delay amount of the clock generator CG221.

Figure 3:
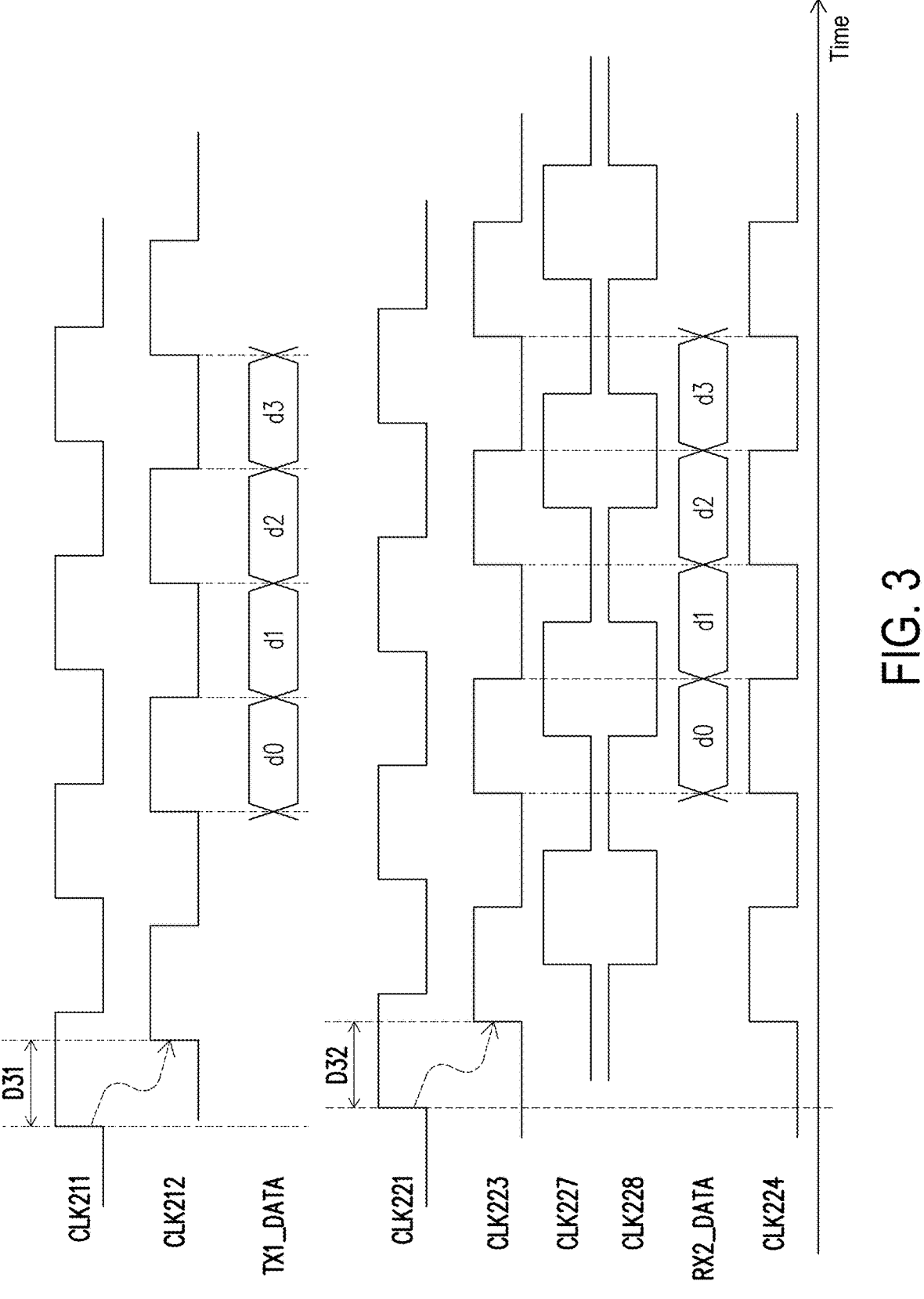
FIG. 3 is a schematic view of a timing of a data signal and a clock signal according to an embodiment of the disclosure.

FIG. 3 is a schematic view of a timing of a data signal and a clock signal according to an embodiment of the disclosure. The horizontal axis in FIG. 3 represents time. A data signal TX1_DATA shown in FIG. 3 may refer to relevant descriptions of the data signal DQ21 and/or the address signal ADD21 shown in FIG. 2, and a data signal RX2_DATA shown in FIG. 3 may refer to relevant descriptions of a data signal DQ22 and/o an address signal ADD22 shown in FIG. 2. Data d0, d1, d2, and d3 shown in FIG. 3 represent data content (e.g., data and/or an address) output by the die 210 to the die 220. The source clock signal CLK211, the gained clock signal CLK212, the source clock signal CLK221, the delayed clock signal CLK223, the gained clock signal CLK224, the delayed clock signal CLK227, and the delayed clock signal CLK228 shown in FIG. 3 may refer to relevant descriptions of the source clock signal CLK211, the gained clock signal CLK212, the source clock signal CLK221, the delayed clock signal CLK223, a gained clock signal CLK224, the delayed clock signal CLK227, and the delayed clock signal CLK228 shown in FIG. 2. A transmission channel of the gained clock signal CLK212 is similar to the transmission channel of the data signal TX1_DATA (such as the data signal DQ21, the address signal ADD21 and the command signal CMD21). Therefore, a transmission delay of the gained clock signal CLK224 is approximately the same as the transmission delay of the data signal RX2_DATA (such as the data signal DQ22, the address signal ADD22 and the command signal CMD22).

Referring to FIGS. 2 and 3, the data signal TX1_DATA of the die 210 becomes the data signal RX2_DATA received by the die 220 through the TSV (or the bump). For example, the data signal DQ21 of the die 210 becomes the data signal DQ22 through the TSV TSV21 (or the bump). The address signal ADD21 of the die 210 becomes the address signal ADD22 through the TSV TSV22 (or the bump). The command signal CMD21 of the die 210 becomes a command signal CMD22 through the TSV TSV23 (or the bump). The data signal DQ22 is a data signal after the data signal DQ21 is delayed by a transmission channel. The address signal ADD22 is a data signal after the address signal ADD21 is delayed by the transmission channel. The command signal CMD22 is a data signal after the command signal CMD21 is delayed by the transmission channel. Based on triggering of the delayed clock signals CLK227 and CLK228, the interface device RX22 may sample/latch the DDR data signal (e.g., the data signal DQ22 and the address signal ADD22) from the die 210 to be provided to the core circuit CORE22. Based on the triggering of the delayed clock signal CLK223, the interface device RX22 may sample/latch the SDR data signal from the die 210 (e.g., the command signal CMD21).

The gained clock signal CLK212 of the die 210 becomes a gained clock signal CLK224 through the TSV TSV24 (or the bump). The phase detector PD22 receives the gained clock signal CLK224 from the die 210. The phase detector PD22 is coupled to the clock generator CG221 to receive the delayed clock signal CLK223. The phase detector PD22 detects a phase difference between the gained clock signal CLK224 and the delayed clock signal CLK223, and generates phase relationship information PE22 corresponding to the phase difference to the core circuit CORE22. For example (but not limited thereto), the phase relationship information PE22 may indicate whether the gained clock signal CLK224 lags or leads the delayed clock signal CLK223. The core circuit CORE22 generates the adjustment signals ADJ22 and ADJ22_90 to the controllable delay lines CDL221, CDL222, and CDL223 based on the phase relationship information PE22.

Based on the above, based on the source clock signal CLK211 of the die 210, the clock transmission circuit CT21 of the die 210 may generate the gained clock signals CLK212 to trigger transmission of the data signal of the die 210. The die 210 may output the data signal, the source clock signal CLK211, and the gained clock signal CLK212 to the die 220. A transmission channel of the gained clock signal CLK212 is similar to the transmission channel of the data signal. Therefore, a transmission delay of the gained clock signal CLK224 is approximately the same as the transmission delay of the data signal. Based on phase tracking of the phase detector PD22, a sum D32 of a delay amount of the controllable delay line CDL221 and the delay amount of the clock generator CG221 in the die 220 is substantially equal to a delay amount D31 of the clock transmission circuit CT21 in the die 210. The die 220 may adjust a delay amount to the source clock signal CLK221 from the die 210 based on a phase of the gained clock signal CLK224 to generate the delayed clock signals CLK223, CLK227, and CLK228. Phases of the delayed clock signals CLK223, CLK227, and CLK228 are different from one another. For example, the phase of the delayed clock signal CLK223 is approximately 90° different from the phase of the delayed clock signal CLK227, and the phase of the delayed clock signal CLK223 is approximately 270° (or −90°) different from the phase of the delayed clock signal CLK228. Since the die 220 may enable the delayed clock signal CLK223 to track and align the phase of the gained clock signal CLK224, the phase of the delayed clock signal CLK223 is easily aligned with the phase of the data signal (e.g., the data signal DQ22, the address signal ADD22, and the command signal CMD22).

FIG. 4 is a schematic flowchart of an operation method of an interface device according to an embodiment of the disclosure. Referring to FIGS. 2 and 4, in step S410, the die 210 (a first die) transmits the data signal, the source clock signal CLK211, and the gained clock signal CLK212 to the die 220 (a second die). In step S420, the controllable delay lines CDL221, CDL222, and CDL223 of the interface device RX22 receive the source clock signal CLK221 from the die 210, and the phase detector PD22 of the interface device RX22 receives the gained clock signal CLK224 from the die 210.

In step S430, the controllable delay line CDL221 adjusts the delay amount to the source clock signal CLK221 according to the adjustment signal ADJ22, and then delays the source clock signal CLK221 to generate the delayed clock signal CLK222. Similar to the controllable delay line CDL221, the controllable delay lines CDL222 and CDL223 adjust the delay amount to the source clock signal CLK221 according to the adjustment signal ADJ22_90, and then delay the source clock signal CLK221 to generate the delayed clock signal (step S430).

In step S440, the clock generator CG221 of the interface device RX22 generates the delayed clock signal CLK223 according to the delayed clock signal CLK222. Similar to the clock generator CG221, the clock generator CG222 generates the delayed clock signal CLK227 according to the delayed clock signal output by the controllable delay line CDL222, and the clock generator CG223 generates the delayed clock signal CLK228 according to the delayed clock signal output by the NOT gate INV22 (step S440).

In step S450, the phase detector PD22 detects the phase difference between the gained clock signal CLK224 and the delayed clock signal CLK223 to generate the phase relationship information PE22. In step S460, the core circuit CORE22 generates the adjustment signal ADJ22 according to the phase relationship information PE22 to the controllable delay line CDL221, and the core circuit CORE22 generates the adjustment signal ADJ22_90 according to the phase relationship information PE22 to the controllable delay lines CDL222 and CDL223.

Figure 5:
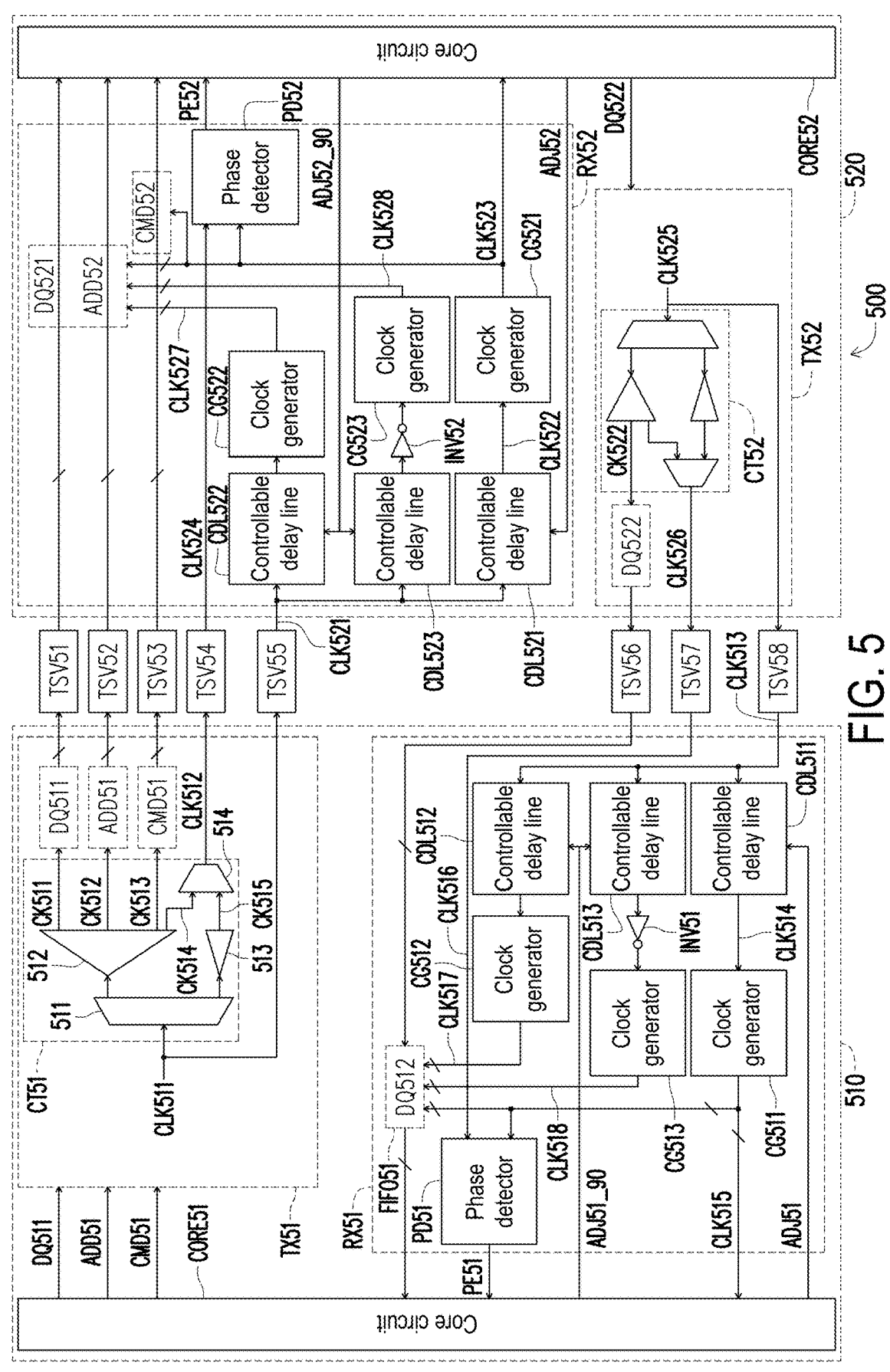
FIG. 5 is a schematic view of a circuit block of a semiconductor device according to another embodiment of the disclosure.

FIG. 5 is a schematic view of a circuit block of a semiconductor device 500 according to another embodiment of the disclosure. The semiconductor device 500 shown in FIG. 5 includes a die 510 and a die 520. The die 510 and the die 520 may be electrically connected to each other. For example, in the embodiment shown in FIG. 5, the die 510 may be electrically connected to the die 520 through TSVs TSV51, TSV52, TSV53, TSV54, TSV55, TSV56, TSV57, and TSV58 (or a bump). According to the actual design, the die 510 and the die 520 may be stacked into a 3D structure. For example, in some application examples, the die 510 and the die 520 shown in FIG. 5 may refer to the relevant descriptions of the die 24 and the die 34 shown in FIG. 1A and be derived by analogy (in this case, the TSVs TSV51, TSV52, TSV53, TSV54, TSV55, TSV56, TSV57, and TSV58 shown in FIG. 5 may be implemented using bumps instead, that is, the TSVs TSV51, TSV52, TSV53, TSV54, TSV55, TSV56, TSV57, and TSV58 shown in FIG. 5 may refer to the relevant description of the bump 26 shown in FIG. 1A and be derived by analogy). In another application examples, the die 510 and the die 520 shown in FIG. 5 may refer to the relevant descriptions of the die 44 and the die 54 shown in FIG. 1B and be derived by analogy (in this case, the TSVs TSV51, TSV52, TSV53, TSV54, TSV55, TSV56, TSV57, and TSV58 shown in FIG. 5 may refer to the relevant description of the TSV 46 shown in FIG. 1B and be derived by analogy).

As shown in FIG. 5, the die 510 includes a core circuit CORE51, an interface device TX51, and an interface device RX51, and the die 520 includes a core circuit CORE52, an interface device TX52, and an interface device RX52. The interface device TX51 includes a clock transmission circuit CT51. The clock transmission circuit CT51 receives a source clock signal CLK511 of the die 510, and generates multiple gained clock signals CK511, CK512, CK513, and CLK512 based on the source clock signal CLK511. Based on triggering of the gained clock signals CK511, CK512, and CK513, the interface device TX51 may output a data signal DQ511, an address signal ADD51, and a command signal CMD51 to the die 520. Generally speaking, the gained clock signal CLK512 lags the source clock signal CLK511. The core circuit CORE51 and the interface device TX51 shown in FIG. 5 may refer to relevant descriptions of the core circuit CORE21 and the interface device TX21 shown in FIG. 2 and be derived by analogy. Therefore, the same details will not be repeated in the following.

In the embodiment shown in FIG. 5, the clock transmission circuit CT51 includes a clock gating circuit 511, a clock tree circuit 512, a clock tree circuit 513, and a clock gating circuit 514. An input end of the clock gating circuit 511 receives the source clock signal CLK511 of the die 510. The clock gating circuit 511 selectively transmits the source clock signal CLK511 to one or both of a first gating end and a second gating end of the clock gating circuit 511. That is, based on control of the core circuit CORE51, the clock gating circuit 511 selectively outputs the source clock signal CLK511 to the clock tree circuit 512 and/or the clock tree circuit 513. For example, in a normal operation mode, the clock gating circuit 511 selectively outputs the source clock signal CLK511 to the clock tree circuit 512. In a power saving mode, the clock gating circuit 511 selectively outputs the source clock signal CLK511 to the clock tree circuit 513.

The clock tree circuit 512 is coupled to the first gating end of the clock gating circuit 511 to receive the source clock signal CLK511. The clock tree circuit 512 may gain fan-out of the clock signal to output multiple gained clock signals (e.g., CK511, CK512, CK513, and CK514). The clock tree circuit 513 is coupled to the second gating end of the clock gating circuit 511 to receive the source clock signal CLK511. A delay amount (or latency) of the clock tree circuit 513 is approximately the same as a delay amount of the clock tree circuit 512, but the clock tree circuit 513 has less fan-out. Therefore, power consumption of the clock tree circuit 513 is less than power consumption of the clock tree circuit 512. The clock tree circuit 513 may gain the clock signal CLK511 to output a gained clock signal CK515.

A first gating end of the clock gating circuit 514 is coupled to the clock tree circuit 512 to receive the gained clock signal CK514. A second gating end of the clock gating circuit 514 is coupled to the clock tree circuit 513 to receive the gained clock signal CK515. Based on the control of the core circuit CORE51, an output end of the clock gating circuit 514 selectively outputs one of the gained clock signal CK514 and the gained clock signal CK515 as the gained clock signal CLK512 to the die 520. For example, in the normal operation mode, the clock gating circuit 514 selectively outputs the gained clock signal CK514 as the gained clock signal CLK512 to the die 520. In the power saving mode, the clock gating circuit 514 selectively outputs the gained clock signal CK515 as the gained clock signal CLK512 to the die 520.

Figure 6:
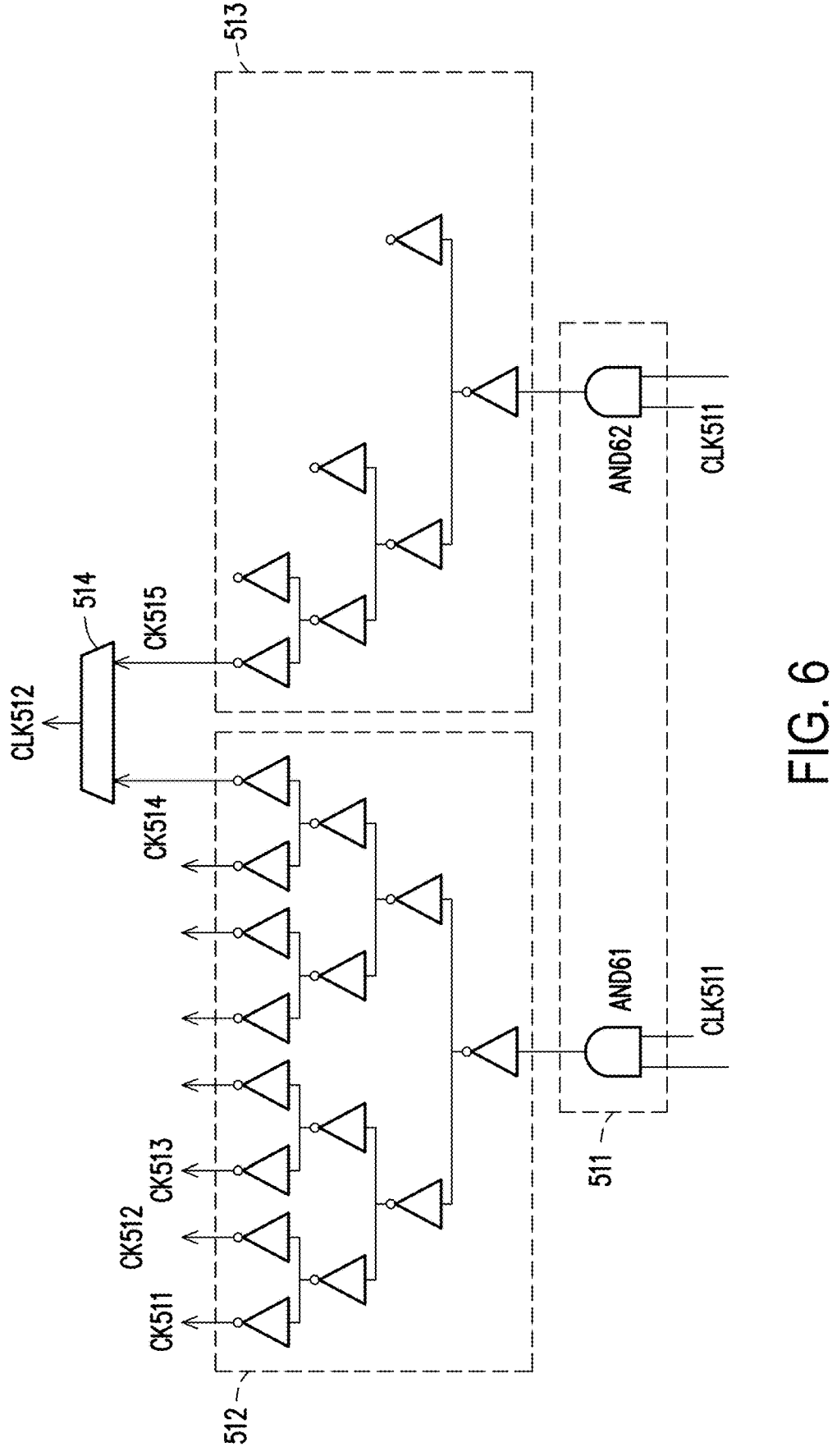
FIG. 6 is a schematic view of a circuit block of a clock gating circuit and a clock tree circuit according to an embodiment of the disclosure.

FIG. 6 is a schematic view of a circuit block of the clock gating circuit 511, the clock tree circuit 512, the clock tree circuit 513 and the clock gating circuit 514 according to an embodiment of the disclosure. The clock gating circuit 511, the clock tree circuit 512, and the clock tree circuit 513 shown in FIG. 6 may be used as one of implementation examples of the clock gating circuit 511, the clock tree circuit 512, and the clock tree circuit 513 shown in FIG. 5. In the embodiment shown in FIG. 6, the clock gating circuit 511 includes AND gates AND61 and AND62. First input ends of the AND gates AND61 and AND62 receive the source clock signal CLK511 of the die 510. Second input ends of the AND gates AND61 and AND62 are controlled by the core circuit CORE51. An output end of the AND gate AND61 is coupled to the clock tree circuit 512. An output end of the AND gate AND62 is coupled to the clock tree circuit 513. Based on the control of the core circuit CORE51, the AND gate AND61 selectively outputs the source clock signal CLK511 to the clock tree circuit 512, and the AND gate AND62 selectively outputs the source clock signal CLK511 to the clock tree circuit 513.

In the embodiment shown in FIG. 6, the clock tree circuit 512 includes a clock tree formed by multiple NOT gates (or buffers). The number of NOT gates (or buffers) in the clock tree circuit 512 may be determined according to the actual design. The number of levels of the NOT gates (or buffers) in the clock tree circuit 512 and a fan-out amount of the clock tree circuit 512 may be determined according to the actual design. The clock tree circuit 513 includes another clock tree formed by multiple NOT gates (or buffers). The number of NOT gates (or buffers) in the clock tree circuit 513 may be determined according to the actual design. The delay amount (or latency) of the clock tree circuit 513 is approximately the same as the delay amount of the clock tree circuit 512, but has less fan-out, as shown in FIG. 6. Therefore, the power consumption of the clock tree circuit 513 is less than the power consumption of the clock tree circuit 512. In the normal operation mode, the clock gating circuit 511 selectively outputs the source clock signal CLK511 to the clock tree circuit 512, and the clock gating circuit 514 selectively outputs the gained clock signal CK514 output by the clock tree circuit 512 as the gained clock signal CLK512 to the die 520. In the power saving mode, the clock gating circuit 511 selectively outputs the source clock signal CLK511 to the clock tree circuit 513, and the clock gating circuit 514 selectively outputs the gained clock signal CK515 output by the clock tree circuit 513 as the gained clock signal CLK512 to the die 520.

Referring to FIG. 5, the interface device RX52 includes a controllable delay line CDL521, a controllable delay line CDL522, a controllable delay line CDL523, a clock generator CG521, a clock generator CG522, a clock generator CG523, a NOT gate INV52, and a phase detector PD52. The controllable delay line CDL521, the controllable delay line CDL522, the controllable delay line CDL523, the clock generator CG521, the clock generator CG522, the clock generator CG523, the NOT gate INV52, and the phase detector PD52 shown in FIG. 5 may refer to relevant descriptions of the controllable delay line CDL221, the controllable delay line CDL222, the controllable delay line CDL223, the clock generator CG221, the clock generator CG222, the clock generator CG223, the NOT gate INV22, and the phase detector PD22 shown in FIG. 2 and be derived by analogy, or the controllable delay line CDL221, the controllable delay line CDL222, the controllable delay line CDL223, the clock generator CG221, the clock generator CG222, the clock generator CG223, the NOT gate INV22, and the phase detector PD22 shown in FIG. 2 may refer to relevant descriptions of the controllable delay line CDL521, the controllable delay line CDL522, the controllable delay line CDL523, the clock generator CG521, the clock generator CG522, the clock generator CG523, the NOT gate INV52, and the phase detector PD52 shown in FIG. 5 and be derived by analogy.

The source clock signal CLK511 of the die 510 becomes a source clock signal CLK521 through the TSV TSV55. The controllable delay line CDL521 receives the source clock signal CLK521 from the die 510. The controllable delay line CDL521 adjusts a delay amount (a first delay amount) to the source clock signal CLK521 according to an adjustment signal ADJ52, and then delays the source clock signal CLK221 to generate a delayed clock signal CLK522. Similar to the controllable delay line CDL521, the controllable delay lines CDL522 and CDL523 receive the source clock signal CLK521 from the die 510. The controllable delay lines CDL522 and CDL523 adjust the delay amount (a second delay amount and a third delay amount) to the source clock signal CLK521 according to an adjustment signal ADJ52_90, and then delay the source clock signal CLK521 to generate a delayed clock signal. Specific implementation of the controllable delay lines CDL522 and CDL523 may refer to the relevant description of the controllable delay line CDL521 and be derived by analogy. Therefore, the same details will not be repeated in the following. According to the adjustment signal ADJ52_90, phases of the delayed clock signals generated by the controllable delay lines CDL522 and CDL523 are approximately 90° different from a phase of the delayed clock signal CLK522 generated by the controllable delay line CDL521. An input end of the NOT gate INV52 is coupled to an output end of the controllable delay line CDL523 to receive the delayed clock signal.

The clock generator CG521 is coupled to the controllable delay line CDL521 to receive the delayed clock signal CLK522. The clock generator CG521 generates a delayed clock signal CLK523 according to the delayed clock signal CLK522. The clock generator CG521 may gain fan-out of the delayed clock signal CLK522. In this embodiment, specific implementation of the clock generator CG521 is not limited. For example, based on the actual design, the clock generator CG521 may include a clock tree circuit or other clock circuits. The clock tree circuit is coupled to the controllable delay line CDL521 to receive the delayed clock signal CLK522. The clock tree circuit generates the delayed clock signal CLK523 according to the delayed clock signal CLK522.

Similar to the clock generator CG221, input ends of the clock generators CG522 and CG523 are respectively coupled to an output end of the controllable delay line CDL522 and an output end of the NOT gate INV52 to receive the corresponding delayed clock signals. The clock generator CG522 generates a delayed clock signal CLK527 according to the delayed clock signal output by the controllable delay line CDL522. The clock generator CG523 generates a delayed clock signal CLK528 according to the delayed clock signal output by the NOT gate INV52. The clock generators CG522 and CG523 may refer to the relevant description of the clock generator CG521 and be derived by analogy. Therefore, the same details will not be repeated in the following. In this embodiment, a delay amount of the clock generator CG522 and a delay amount of the clock generator CG523 are approximately equal to a delay amount of the clock generator CG521. The delayed clock signals CLK523, CLK527, and CLK528 shown in FIG. 5 may refer to relevant descriptions of the delayed clock signals CLK223, CLK227, and CLK228 shown in FIGS. 2 and 3 and be derived by analogy. Therefore, the same details will not be repeated in the following.

A data signal of the die 510 becomes a data signal received by the die 520 through the TSV (or the bump). For example, the data signal DQ511 of the die 510 becomes a data signal DQ521 through the TSV TSV51 (or the bump). The address signal ADD51 of the die 510 becomes an address signal ADD52 through the TSV TSV52 (or the bump). The command signal CMD51 of the die 510 becomes a command signal CMD52 through the TSV TSV53 (or the bump). The data signal DQ521 is a data signal after the data signal DQ511 is delayed by the transmission channel. The address signal ADD52 is a data signal after the address signal ADD51 is delayed by the transmission channel. The command signal CMD52 is a data signal after the command signal CMD51 is delayed by the transmission channel. Based on triggering of the delayed clock signals CLK523, CLK527, and CLK528, the interface device RX52 may sample/latch the DDR data signal (e.g., the data signal DQ521 and the address signal ADD52) from the die 510 to be provided to the core circuit CORE52. Based on the triggering of the delayed clock signal CLK523, the interface device RX52 may sample/latch the SDR data signal from the die 510 (s e.g., the command signal CMD52).

The gained clock signal CLK512 of the die 510 becomes a gained clock signal CLK524 through the TSV TSV54 (or the bump). The phase detector PD52 receives the gained clock signal CLK524 from the die 510. The phase detector PD52 is coupled to the clock generator CG521 to receive the delayed clock signal CLK523. The phase detector PD52 detects a phase difference between the gained clock signal CLK524 and the delayed clock signal CLK523, and generates phase relationship information PE52 corresponding to the phase difference to the core circuit CORE52. The core circuit CORE52 generates the adjustment signals ADJ52 and ADJ52_90 to the controllable delay lines CDL521, CDL522, and CDL523 according to the phase relationship information PE52. The phase relationship information PE52, the interface device RX52, and the core circuit CORE52 shown in FIG. 5 may refer to relevant descriptions of the phase relationship information PE22, the interface device RX22, and the core circuit CORE22 shown in FIG. 2 and be derived by analogy. Therefore, the same details will not be repeated in the following.

In the embodiment shown in FIG. 5, the interface device TX52 includes a clock transmission circuit CT52 arranged on the die 520. The clock transmission circuit CT52 receives a source clock signal CLK525 of the die 520. The clock transmission circuit CT52 generates a gained clock signal CLK526 based on the source clock signal CLK525. Based on triggering of a gained clock signal CK522 of the clock transmission circuit CT52, the interface device TX52 may output a data signal DQ522 of the die 520 to the die 510. The interface device TX52 and the clock transmission circuit CT52 may refer to relevant descriptions of the interface device TX51 and the clock transmission circuit CT51 and be derived by analogy. Therefore, the same details will not be repeated in the following.

The interface device RX51 includes a controllable delay line CDL511, a controllable delay line CDL512, a controllable delay line CDL513, a clock generator CG511, a clock generator CG512, a clock generator CG513, a NOT gate INV51, a phase detector PD51, and a first in first out (FIFO) buffer FIFO51.

The source clock signal CLK525 of the die 520 becomes a source clock signal CLK513 through the TSV TSV58. The controllable delay line CDL511 receives the source clock signal CLK513 from the die 520. The controllable delay line CDL511 adjusts a delay amount to the source clock signal CLK513 according to an adjustment signal ADJ51, and then delays the source clock signal CLK513 to generate a delayed clock signal CLK514. Similar to the controllable delay line CDL511, the controllable delay lines CDL512 and CDL513 receive the source clock signal CLK513 from the die 520. The controllable delay lines CDL512 and CDL513 adjust the delay amount to the source clock signal CLK513 according to an adjustment signal ADJ51_90, and then delay the source clock signal CLK513 to generate a delayed clock signal. According to the adjustment signal ADJ51_90, phases of the delayed clock signals generated by the controllable delay lines CDL512 and CDL513 are approximately 90° different from a phase of the delayed clock signal CLK514 generated by the controllable delay line CDL511. An input end of the NOT gate INV51 is coupled to an output end of the controllable delay line CDL513 to receive the delayed clock signal.

The clock generator CG511 is coupled to the controllable delay line CDL511 to receive the delayed clock signal CLK514. The clock generator CG511 generates a delayed clock signal CLK515 according to the delayed clock signal CLK514. The clock generator CG511 may gain fan-out of the delayed clock signal CLK514. Similar to the clock generator CG511, input ends of the clock generators CG512 and CG513 are respectively coupled to an output end of the controllable delay line CDL512 and an output end of the NOT gate INV51 to receive the corresponding delayed clock signal. The clock generator CG512 generates a delayed clock signal CLK517 according to the delayed clock signal output by the controllable delay line CDL512. The clock generator CG513 generates a delayed clock signal CLK518 according to the delayed clock signal output by the NOT gate INV51. The clock generators CG512 and CG513 may refer to the relevant description of the clock generator CG511 and be derived by analogy. Therefore, the same details will not be repeated in the following. In this embodiment, a delay amount of the clock generator CG512 and a delay amount of the clock generator CG513 are approximately equal to a delay amount of the clock generator CG511. The delayed clock signals CLK515, CLK517, and CLK518 shown in FIG. 5 may refer to the relevant descriptions of the delayed clock signals CLK223, CLK227, and CLK228 shown in FIGS. 2 and 3 and be derived by analogy. Therefore, the same details will not be repeated in the following.

The data signal DQ522 of the die 520 becomes a data signal DQ512 through the TSV TSV56 (or the bump). The data signal DQ512 is a data signal after the data signal DQ522 is delayed by the transmission channel. Based on triggering of the delayed clock signals CLK515, CLK517, and CLK518, the FIFO buffer FIFO51 may sample/latch the DDR data signal from the die 520 (e.g., the data signal DQ512).

The gained clock signal CLK526 of the die 520 becomes a gained clock signal CLK516 through the TSV TSV57 (or the bump). The phase detector PD51 receives the gained clock signal CLK516 from the die 520. The phase detector PD51 is coupled to the clock generator CG511 to receive the delayed clock signal CLK515. The phase detector PD51 detects a phase difference between the gained clock signal CLK516 and the delayed clock signal CLK515 to generate phase relationship information PE51. The core circuit CORE51 generates the adjustment signals ADJ51 and ADJ51_90 according to the phase relationship information PE51 to the controllable delay lines CDL511, CDL512, and CDL513. The interface device RX51, the controllable delay line CDL511, the controllable delay line CDL512, the controllable delay line CDL513, the clock generator CG511, the clock generator CG512, the clock generator CG513, the NOT gate INV51, and the phase detector PD51 may refer to the relevant descriptions of the interface device RX52, the controllable delay line CDL521, the controllable delay line CDL522, the controllable delay line CDL523, the clock generator CG521, the clock generator CG522, the clock generator CG523, the NOT gate INV52, and the phase detector PD52 and be derived by analogy. Therefore, the same details will not be repeated in the following.

Based on the above, based on the source clock signal CLK525 of the die 520, the clock transmission circuit CT52 of the die 520 may generate the gained clock signals CLK526 and CK522. The gained clock signal CK522 is used to trigger the transmission of the data signal DQ522 of the die 520. The die 520 may output the data signal DQ522, the source clock signal CLK525, and the gained clock signal CLK526 to the die 510. A transmission channel of the gained clock signal CLK526 is similar to a transmission channel of the data signal DQ522. Therefore, a transmission delay of the gained clock signal CLK526 is approximately the same as a transmission delay of the data signal DQ522. A sum of a delay amount of the controllable delay line CDL511 and a delay amount of the clock generator CG511 in the die 510 is substantially equal to a delay amount of the clock transmission circuit CT52 in the die 520. The die 510 may adjust the delay amount to the source clock signal CLK513 from the die 520 based on a phase of the gained clock signal CLK516 to generate the delayed clock signal CLK515. Since the die 510 may enable the gained clock signal CLK516 and the delayed clock signal CLK515 to track phases with each other, the phase of the delayed clock signal CLK515 may be easily aligned with the phase of the data signal DQ512.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. An interface device adapted for a semiconductor device, wherein the semiconductor device comprises a first die and a second die, the first die and the second die are electrically connected to be stacked into a 3D structure, and the interface device comprises:
a first controllable delay line arranged on the second die, wherein the first controllable delay line receives a first source clock signal from the first die, and the first controllable delay line adjusts a first delay amount to the first source clock signal according to a first adjustment signal, thereby delaying the first source clock signal to generate a first delayed clock signal;
a first clock generator arranged on the second die, wherein the first clock generator is coupled to the first controllable delay line to receive the first delayed clock signal, and the first clock generator generates a second delayed clock signal according to the first delayed clock signal;
a phase detector arranged on the second die, wherein the phase detector receives a first gained clock signal from the first die, the phase detector is coupled to the first clock generator to receive the second delayed clock signal, and the phase detector detects a phase difference between the first gained clock signal and the second delayed clock signal to generate phase relationship information;
a second controllable delay line arranged on the second die, wherein the second controllable delay line receives the first source clock signal from the first die, and the second controllable delay line adjusts a second delay amount to the first source clock signal according to a second adjustment signal, thereby delaying the first source clock signal to generate a third delayed clock signal; and
a second clock generator arranged on the second die, wherein the second clock generator is coupled to the second controllable delay line to receive the third delayed clock signal, and the second clock generator generates a fourth delayed clock signal according to the third delayed clock signal,
wherein the first adjustment signal and the second adjustment signal are generated according to the phase relationship information, and the first delay amount is different from the second delay amount.

2. The interface device according to claim 1, wherein the first controllable delay line and the second controllable delay line receive the first source clock signal from the first die through a first through-silicon-via or a first bump, and the phase detector receives the first gained clock signal from the first die through a second through-silicon-via or a second bump.

3. The interface device according to claim 1, wherein a clock transmission circuit of the first die receives the first source clock signal, and the clock transmission circuit of the first die generates the first gained clock signal based on the first source clock signal.

4. The interface device according to claim 3, wherein a sum of the first delay amount of the first controllable delay line and a third delay amount of the first clock generator in the second die is substantially equal to a delay amount of the clock transmission circuit in the first die.

5. The interface device according to claim 1, wherein the first adjustment signal and the second adjustment signal are generated by a core circuit arranged on the second die according to the phase relationship information.

6. The interface device according to claim 1, wherein the first controllable delay line comprises:
a digital controlled delay line controlled by the first adjustment signal, wherein the digital controlled delay line receives the first source clock signal, and the digital controlled delay line delays the first source clock signal according to the first adjustment signal to generate the first delayed clock signal.

7. The interface device according to claim 1, wherein the first clock generator comprises:
a clock tree circuit coupled to the first controllable delay line to receive the first delayed clock signal, wherein the clock tree circuit generates the second delayed clock signal according to the first delayed clock signal.

8. The interface device according to claim 1, further comprising:
a clock transmission circuit arranged on the second die, wherein the clock transmission circuit receives a second source clock signal of the second die, and the clock transmission circuit generates a second gained clock signal to the first die based on the second source clock signal.

9. The interface device according to claim 8, wherein the clock transmission circuit comprises:
a first clock gating circuit having an input end, a first gating end, and a second gating end, wherein the input end of the first clock gating circuit receives the second source clock signal of the second die, and the first clock gating circuit selectively transmits the second source clock signal to one or both of the first gating end and the second gating end of the first clock gating circuit;

a first clock tree circuit coupled to the first gating end of the first clock gating circuit to receive the second source clock signal;

a second clock tree circuit coupled to the second gating end of the first clock gating circuit to receive the second source clock signal; and a second clock gating circuit having an output end, a first gating end, and a second gating end, wherein the first gating end of the second clock gating circuit is coupled to the first clock tree circuit to receive a third gained clock signal, the second gating end of the second clock gating circuit is coupled to the second clock tree circuit to receive a fourth gained clock signal, and the output end of the second clock gating circuit selectively outputs one of the third gained clock signal and the fourth gained clock signal as the second gained clock signal to the first die.

10. The interface device according to claim 8, wherein the second source clock signal of the second die is output to the first die through a third through-silicon-via or a third bump, and the clock transmission circuit outputs the second gained clock signal to the first die through a fourth through-silicon-via or a fourth bump.

11. The interface device according to claim 8, wherein the second source clock signal of the second die is output to the first die, the first die delays the second source clock signal to generate a fifth delayed clock signal, and the first die adjusts a third delay amount to the second source clock signal based on a phase difference between the second gained clock signal and the fifth delayed clock signal.

12. The interface device according to claim 11, wherein a delay amount of the first die used to delay the second source clock signal to generate the fifth delayed clock signal is substantially equal to a delay amount of the clock transmission circuit in the second die.

13. The interface device according to claim 1, further comprising:

a third controllable delay line arranged on the second die, wherein the third controllable delay line receives the first source clock signal from the first die, and the third controllable delay line adjusts a third delay amount to the first source clock signal according to the second adjustment signal, thereby delaying the first source clock signal to generate a fifth delayed clock signal;

a NOT gate arranged on the second die, wherein an input end of the NOT gate is coupled to an output end of the third controllable delay line to receive the fifth delayed clock signal; and a third clock generator arranged on the second die, wherein an input end of the third clock generator is coupled to an output end of the NOT gate to receive a sixth delayed clock signal, and the third clock generator generates a seventh delayed clock signal according to the sixth delayed clock signal, wherein phases of the second delayed clock signal, the fourth delayed clock signal, and the seventh delayed clock signal are different from one another.

14. An operation method of an interface device, wherein the interface device is adapted for a semiconductor device, the semiconductor device comprises a first die and a second die, the first die and the second die are electrically connected to be stacked into a 3D structure, and the operation method comprises:

receiving a first source clock signal from the first die by a first controllable delay line of the interface device, wherein the first controllable delay line is arranged on the second die;

adjusting a first delay amount to the first source clock signal according to a first adjustment signal, thereby delaying the first source clock signal to generate a first delayed clock signal by the first controllable delay line;

generating a second delayed clock signal according to the first delayed clock signal by a first clock generator of the interface device, wherein the first clock generator is arranged on the second die, and the first clock generator is coupled to the first controllable delay line to receive the first delayed clock signal;

receiving a first gained clock signal from the first die by a phase detector of the interface device, wherein the phase detector is arranged on the second die, and the phase detector is coupled to the first clock generator to receive the second delayed clock signal;

detecting a phase difference between the first gained clock signal and the second delayed clock signal by the phase detector to generate phase relationship information;

receiving the first source clock signal from the first die by a second controllable delay line of the interface device, wherein the second controllable delay line is arranged on the second die;

adjusting a second delay amount to the first source clock signal according to a second adjustment signal, thereby delaying the first source clock signal to generate a third delayed clock signal by the second controllable delay line, wherein the first delay amount is different from the second delay amount;

generating a fourth delayed clock signal according to the third delayed clock signal by a second clock generator of the interface device, wherein the second clock generator is arranged on the second die, and the second clock generator is coupled to the second controllable delay line to receive the third delayed clock signal; and generating the first adjustment signal and the second adjustment signal according to the phase relationship information.

15. The operation method according to claim 14, wherein the first controllable delay line receives the first source clock signal from the first die through a first through-silicon-via or a first bump, and the phase detector receives the first gained clock signal from the first die through a second through-silicon-via or a second bump.

16. The operation method according to claim 14, wherein a clock transmission circuit of the first die receives the first source clock signal, and the clock transmission circuit of the first die generates the first gained clock signal based on the first source clock signal.

17. The operation method according to claim 16, wherein a sum of the first delay amount of the first controllable delay line and a third delay amount of the first clock generator in the second die is substantially equal to a delay amount of the clock transmission circuit in the first die.

18. The operation method according to claim 14, further comprising:

receiving a second source clock signal of the second die by a clock transmission circuit of the interface device, wherein the clock transmission circuit is arranged on the second die; and generating a second gained clock signal to the first die based on the second source clock signal by the clock transmission circuit.

19. The operation method according to claim 18, further comprising:

selectively transmitting, by a first clock gating circuit of the clock transmission circuit, the second source clock signal of the second die to one or both of a first gating end and a second gating end of the first clock gating circuit, wherein the first gating end of the first clock gating circuit is coupled to a first clock tree circuit of the clock transmission circuit, the second gating end of the first clock gating circuit is coupled to a second clock tree circuit of the clock transmission circuit, a first gating end of a second clock gating circuit of the clock transmission circuit is coupled to the first clock tree circuit to receive a third gained clock signal, and a second gating end of the second clock gating circuit is coupled to the second clock tree circuit to receive a fourth gained clock signal; and selectively outputting one of the third gained clock signal and the fourth gained clock signal as the second gained clock signal to the first die by the second clock gating circuit.

20. The operation method according to claim 18, wherein the second source clock signal of the second die is output to the first die through a third through-silicon-via or a third bump, and the clock transmission circuit outputs the second gained clock signal to the first die through a fourth through-silicon-via or a fourth bump.

21. The operation method according to claim 18, wherein the second source clock signal of the second die is output to the first die, the first die delays the second source clock signal to generate a fifth delayed clock signal, and the first die adjusts a third delay amount to the second source clock signal based on a phase difference between the second gained clock signal and the fifth delayed clock signal.

22. The operation method according to claim 21, wherein a delay amount of the first die delaying the second source clock signal to generate the fifth delayed clock signal is substantially equal to a delay amount of the clock transmission circuit in the second die.

23. The operation method according to claim 14, further comprising:

receiving the first source clock signal from the first die by a third controllable delay line of the interface device, wherein the third controllable delay line is arranged on the second die;

adjusting a third delay amount to the first source clock signal according to the second adjustment signal, thereby delaying the first source clock signal to generate a fifth delayed clock signal by the third controllable delay line;

receiving the fifth delayed clock signal by a NOT gate of the interface device, wherein the NOT gate is arranged on the second die, and an input end of the NOT gate is coupled to an output end of the third controllable delay line; and generating a seventh delayed clock signal according to a sixth delayed clock signal of the NOT gate by a third clock generator of the interface device, wherein the third clock generator is arranged on the second die, and an input end of the third clock generator is coupled to an output end of the NOT gate to receive the sixth delayed clock signal, wherein phases of the second delayed clock signal, the fourth delayed clock signal, and the seventh delayed clock signal are different from one another.

24. A semiconductor device, wherein the semiconductor device comprises a first die and a second die, the first die and the second die are electrically connected to be stacked into a 3D structure, and the semiconductor device comprises:

a first clock transmission circuit arranged on the first die, wherein the first clock transmission circuit receives a first source clock signal of the first die, and the first clock transmission circuit generates a first gained clock signal based on the first source clock signal;

a first controllable delay line arranged on the second die, wherein the first controllable delay line receives the first source clock signal from the first die, and the first controllable delay line adjusts a first delay amount to the first source clock signal according to a first adjustment signal, thereby delaying the first source clock signal to generate a first delayed clock signal;

a first clock generator arranged on the second die, wherein the first clock generator is coupled to the first controllable delay line to receive the first delayed clock signal, and the first clock generator generates a second delayed clock signal according to the first delayed clock signal;

a first phase detector arranged on the second die, wherein the first phase detector receives the first gained clock signal from the first die, the first phase detector is coupled to the first clock generator to receive the second delayed clock signal, and the first phase detector detects a phase difference between the first gained clock signal and the second delayed clock signal to generate first phase relationship information;

a second controllable delay line arranged on the second die, wherein the second controllable delay line receives the first source clock signal from the first die, and the second controllable delay line adjusts a second delay amount to the first source clock signal according to a second adjustment signal, thereby delaying the first source clock signal to generate a third delayed clock signal; and a second clock generator arranged on the second die, wherein the second clock generator is coupled to the second controllable delay line to receive the third delayed clock signal, and the second clock generator generates a fourth delayed clock signal according to the third delayed clock signal, wherein the first adjustment signal and the second adjustment signal are generated according to the first phase relationship information, and the first delay amount is different from the second delay amount.

25. The semiconductor device according to claim 24, wherein the first controllable delay line of the second die receives the first source clock signal from the first die through a first through-silicon-via or a first bump, and the first phase detector of the second die receives the first gained clock signal from the first die through a second through-silicon-via or a second bump.

26. The semiconductor device according to claim 24, wherein a sum of the first delay amount of the first controllable delay line and a third delay amount of the first clock generator in the second die is substantially equal to a delay amount of the first clock transmission circuit in the first die.

27. The semiconductor device according to claim 24, further comprising:

a core circuit arranged on the second die, wherein the core circuit generates the first adjustment signal and the second adjustment signal according to the first phase relationship information.

28. The semiconductor device according to claim 24, wherein the first controllable delay line comprises:

a digital controlled delay line controlled by the first adjustment signal, wherein the digital controlled delay line receives the first source clock signal, and the digital controlled delay line delays the first source clock signal according to the first adjustment signal to generate the first delayed clock signal.

29. The semiconductor device according to claim 24, wherein the first clock generator comprises:

a clock tree circuit coupled to the first controllable delay line to receive the first delayed clock signal, wherein the first clock tree circuit generates the second delayed clock signal according to the first delayed clock signal.

30. The semiconductor device according to claim 24, wherein the first clock transmission circuit comprises:

a first clock gating circuit having an input end, a first gating end, and a second gating end, wherein the input end of the first clock gating circuit receives the first source clock signal of the first die, and the first clock gating circuit selectively transmits the first source clock signal to one or both of the first gating end and the second gating end of the first clock gating circuit;

a first clock tree circuit coupled to the first gating end of the first clock gating circuit to receive the first source clock signal;

a second clock tree circuit coupled to the second gating end of the first clock gating circuit to receive the first source clock signal; and a second clock gating circuit having an output end, a first gating end, and a second gating end, wherein the first gating end of the second clock gating circuit is coupled to the first clock tree circuit to receive a third gained clock signal, the second gating end of the second clock gating circuit is coupled to the second clock tree circuit to receive a fourth gained clock signal, and the output end of the second clock gating circuit selectively outputs one of the third gained clock signal and the fourth gained clock signal as the first gained clock signal to the second die.

31. The semiconductor device according to claim 24, further comprising:

a second clock transmission circuit arranged on the second die, wherein the second clock transmission circuit receives a second source clock signal of the second die, and the second clock transmission circuit generates a second gained clock signal based on the second source clock signal;

a third controllable delay line arranged on the first die, wherein the third controllable delay line receives the second source clock signal from the second die, and the third controllable delay line adjusts a third delay amount to the second source clock signal according to a third adjustment signal, thereby delaying the second source clock signal to generate a fifth delayed clock signal;

a third clock generator arranged on the first die, wherein the third clock generator is coupled to the third controllable delay line to receive the fifth delayed clock signal, and the third clock generator generates a sixth delayed clock signal according to the fifth delayed clock signal;

a second phase detector arranged on the first die, wherein the second phase detector receives the second gained clock signal from the second die, the second phase detector is coupled to the third clock generator to receive the sixth delayed clock signal, and the second phase detector detects a phase difference between the second gained clock signal and the sixth delayed clock signal to generate second phase relationship information;

a fourth controllable delay line arranged on the first die, wherein the fourth controllable delay line receives the second source clock signal from the second die, and the fourth controllable delay line adjusts a fourth delay amount to the second source clock signal according to a fourth adjustment signal, thereby delaying the second source clock signal to generate a seventh delayed clock signal; and a fourth clock generator arranged on the first die, wherein the fourth clock generator is coupled to the fourth controllable delay line to receive the seventh delayed clock signal, and the fourth clock generator generates an eighth delayed clock signal according to the seventh delayed clock signal, wherein the third adjustment signal and the fourth adjustment signal are generated according to the second phase relationship information, and the third delay amount is different from the fourth delay amount.

32. The semiconductor device according to claim 31, wherein the third controllable delay line of the first die receives the second source clock signal from the second die through a first through-silicon-via or a first bump, and the second phase detector of the first die receives the second gained clock signal from the second die through a second through-silicon-via or a second bump.

33. The semiconductor device according to claim 31, wherein a sum of the third delay amount of the third controllable delay line and a fifth delay amount of the third clock generator in the first die is substantially equal to a delay amount of the second clock transmission circuit in the second die.

34. The semiconductor device according to claim 31, further comprising:

a core circuit arranged on the first die, wherein the core circuit generates the third adjustment signal and the fourth adjustment signal according to the second phase relationship information.

35. The semiconductor device according to claim 31, wherein the third controllable delay line comprises:

a digital controlled delay line controlled by the third adjustment signal, wherein the digital controlled delay line receives the second source clock signal, and the digital controlled delay line delays the second source clock signal according to the third adjustment signal to generate the fifth delayed clock signal.

36. The semiconductor device according to claim 31, wherein the third clock generator comprises:

a clock tree circuit coupled to the third controllable delay line to receive the fifth delayed clock signal, wherein the clock tree circuit generates the sixth delayed clock signal according to the fifth delayed clock signal.

37. The semiconductor device according to claim 31, wherein the second clock transmission circuit comprises:

a first clock gating circuit having an input end, a first gating end, and a second gating end, wherein the input end of the first clock gating circuit receives the second source clock signal of the second die, and the first clock gating circuit selectively transmits the second source clock signal to one or both of the first gating end and the second gating end of the first clock gating circuit;

a first clock tree circuit coupled to the first gating end of the first clock gating circuit to receive the second source clock signal;

a second clock tree circuit coupled to the second gating end of the first clock gating circuit to receive the second source clock signal; and a second clock gating circuit having an output end, a first gating end, and a second gating end, wherein the first gating end of the second clock gating circuit is coupled to the first clock tree circuit to receive a third gained clock signal, the second gating end of the second clock gating circuit is coupled to the second clock tree circuit to receive a fourth gained clock signal, and the output end of the second clock gating circuit selectively outputs one of the third gained clock signal and the fourth gained clock signal as the second gained clock signal to the first die.

38. The semiconductor device according to claim 31, further comprising:

a fifth controllable delay line arranged on the first die, wherein the fifth controllable delay line receives the second source clock signal from the second die, and the fifth controllable delay line adjusts a fifth delay amount to the second source clock signal according to the fourth adjustment signal, thereby delaying the second source clock signal to generate a ninth delayed clock signal;

a NOT gate arranged on the first die, wherein an input end of the NOT gate is coupled to an output end of the fifth controllable delay line to receive the ninth delayed clock signal; and a fifth clock generator arranged on the first die, wherein an input end of the fifth clock generator is coupled to an output end of the NOT gate to receive a tenth delayed clock signal, and the fifth clock generator generates an eleventh delayed clock signal according to the tenth delayed clock signal, wherein phases of the sixth delayed clock signal, the eighth delayed clock signal, and the eleventh delayed clock signal are different from one another.

39. The semiconductor device according to claim 24, further comprising:

a third controllable delay line arranged on the second die, wherein the third controllable delay line receives the first source clock signal from the first die, and the third controllable delay line adjusts a third delay amount to the first source clock signal according to the second adjustment signal, thereby delaying the first source clock signal to generate a fifth delayed clock signal;

a NOT gate arranged on the second die, wherein an input end of the NOT gate is coupled to an output end of the third controllable delay line to receive the fifth delayed clock signal; and a third clock generator arranged on the second die, wherein an input end of the third clock generator is coupled to an output end of the NOT gate to receive a sixth delayed clock signal, and the third clock generator generates a seventh delayed clock signal according to the sixth delayed clock signal, wherein phases of the second delayed clock signal, the fourth delayed clock signal, and the seventh delayed clock signal are different from one another.

* * * * *